United States Patent [19]

Boulic

[11] Patent Number: 5,430,411
[45] Date of Patent: Jul. 4, 1995

[54] HIGH-FREQUENCY AMPLIFIER ARRANGEMENT, TRANSCEIVER STATION COMPRISING SUCH AN AMPLIFIER ARRANGEMENT AND MOBILE RADIO SYSTEM COMPRISING SUCH STATIONS

[75] Inventor: Claude Boulic, Paray Vieille Postes, France

[73] Assignee: U.S. Philips Corporation, New York, N.Y.

[21] Appl. No.: 193,839

[22] Filed: Feb. 8, 1994

[30] Foreign Application Priority Data

Feb. 17, 1993 [FR] France ................. 93 01804

[51] Int. Cl.⁶ ............................................. H03G 3/30
[52] U.S. Cl. ........................... 330/284; 330/124 R; 330/145; 330/295; 455/89; 455/116
[58] Field of Search ............ 330/124 R, 144, 145, 330/284, 295; 455/89, 116

[56] References Cited

U.S. PATENT DOCUMENTS

| | | | |
|---|---|---|---|
| 3,371,284 | 2/1968 | Engelbrecht | 330/31 |
| 4,216,445 | 8/1980 | Abajian | 333/81 R |
| 5,066,924 | 11/1991 | Wendt | 330/284 X |

FOREIGN PATENT DOCUMENTS 1452462 10/1965 France .
1338000 9/1987 U.S.S.R. .................. 330/284

OTHER PUBLICATIONS

L. Nystrom, "A New Microwave Variable Power Divider", IEEE Transactions on Microwave Theory and Techniques, vol. MTT-27, No. 1, Jan. 1979, pp. 89–90.

*Primary Examiner*—James B. Mullins
*Attorney, Agent, or Firm*—Leroy Eason

[57] ABSTRACT

A high frequency amplifying system includes an input coupling circuit having an input terminal for receiving a high frequency signal, a pair of amplifiers, and an impedance mismatch circuit for coupling each amplifier to a respective output terminal of the coupling circuit. The impedance mismatch circuit is controllable by a control signal supplied thereto to produce a selected degree of mismatch between the coupling circuit and the input impedances of the amplifiers, to thereby provide adjustable gain control of the amplifying system. The coupling circuit introduces phase shifts between the input and output terminals thereof which attenuates reflection therebetween of intermodulation products resulting from the presence of interfering signals at any of such terminals.

5 Claims, 2 Drawing Sheets

HIGH-FREQUENCY AMPLIFIER ARRANGEMENT, TRANSCEIVER STATION COMPRISING SUCH AN AMPLIFIER ARRANGEMENT AND MOBILE RADIO SYSTEM COMPRISING SUCH STATIONS

BACKGROUND OF THE INVENTION

1. Field of the Invention

The present invention concerns a high-frequency amplifier arrangement comprising an input coupling circuit which has at least a first and a second access to couple a first and a second system, at least one of which is an amplifier.

Such amplifier arrangements according to the invention are particularly used for base transceiver stations of a mobile radio network. Such a network is, in effect, formed by various base transceiver stations covering each a defined geographical area and transmitting over various frequency channels which are very close together. In order to avoid interference among areas, the output power of each base transceiver station is to be strictly limited to the coverage area.

2. Description of the Related Art

A high-frequency amplifier is specifically known from French Patent Specification no. 1452462. However, no output power controller is provided.

For making the output power of the amplifiers vary, PIN-diode attenuators are known to be used. However, when the diodes used in such attenuators are to be capable of carrying high power levels, higher than 10 mW for example, they become very costly.

SUMMARY OF THE INVENTION

It is an object of the present invention to provide an amplifier arrangement which does not have these drawbacks.

Therefore, an amplifier arrangement according to the invention comprises a gain controller formed by a mismatch circuit of input impedances of the first and second systems, so that the values of these impedances led back to the first and second accesses of the input coupling circuit are similar.

In another embodiment of an amplifier arrangement according to the invention, the first and second systems are amplifier systems whose outputs are coupled by a coupling circuit called output coupling circuit.

This structure is advantageous in that it permits attenuation of intermodulation owing to stray signals received through the output of the amplifier arrangement and coming from neighbouring amplifier arrangements, when the station comprises a plurality of amplifier arrangements.

In a preferred embodiment of an arrangement according to the invention the mismatch circuit is a variable impedance circuit formed by a group of PIN-diodes.

Finally, in a particularly advantageous embodiment of the arrangement according to the invention, the coupling circuit is a 90° hybrid coupler.

The invention likewise relates to a transceiver station for a mobile radio network which comprises such an amplifier arrangement, as well as a mobile radio system comprising such stations.

BRIEF DESCRIPTION OF THE DRAWINGS

Other features, details and advantages of the invention will become apparent from the following description given with regard to the appended drawings in which.

DESCRIPTION OF THE PREFERRED EMBODIMENTS

Figure 1:
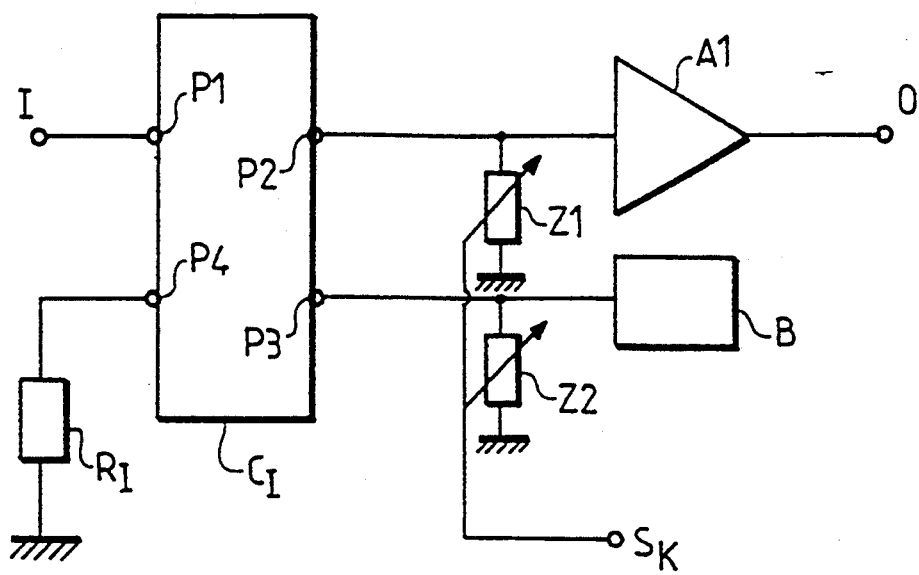
FIGS. 1 and 2 are basic circuit diagrams of an arrangement according to the invention.

As shown in FIG. 1, an amplifier arrangement according to the invention comprises an input coupling circuit $C_I$ as described in said French Patent Specification No. 1452462, for example, which has four accesses numbered P1 to P4. Access P1 forms input I of the amplifier arrangement and receives the high-frequency signal. Access P2 is connected to the input of an amplifier system A1, and to one terminal of a first variable impedance Z1 whose other terminal is connected to earth. Access P3 is connected to a second system B and to one terminal of a second variable impedance Z2 whose other terminal is connected to earth. Access P4 is an isolating access connected to earth via a first resistor $R_I$. The amplifier system A1 has an output 0 which is the output of the amplifier arrangement. The two variable impedances Z1 and Z2 are simultaneously controlled by a control signal available on input $S_K$.

This structure connected at the input of a 90° hybrid coupler permits a mismatch of the input impedances of the two systems A1 and B, without influencing the stage preceding the amplifier arrangement. In effect, the two impedances Z1 and Z2 vary in such a way that the values of the mismatch input impedances of the two systems A1 and B led back to the accesses P2 and P3 respectively, of the input coupler $C_I$, are similar. A like power proportion is thus reflected to the accesses P2 and P3 of the input coupler $C_I$. According to the properties of such a coupler, a signal arriving at the access P1 coming from the access P3 is phase shifted through 90° relative to a signal coming from the access P2; and a signal available on the access P3 coming from the access P1 is phase shifted through 90° relative to a signal of the same origin, available on access P2. The two reflected signals are thus phase shifted through 180° on the access P1. The effect of the return signal on the input of the arrangement is zero. On the other hand, the reflected signals arrive in-phase at the access P4. They will thus be added together and be absorbed by the load $R_I$.

When such an amplifier arrangement is used for mobile radio, it is particularly advantageous to select amplifier systems working in a linear order. In effect, when each base transceiver station transmits over various channels having frequencies very close together, this makes it possible to avoid interchannel interference.

Figure 2:
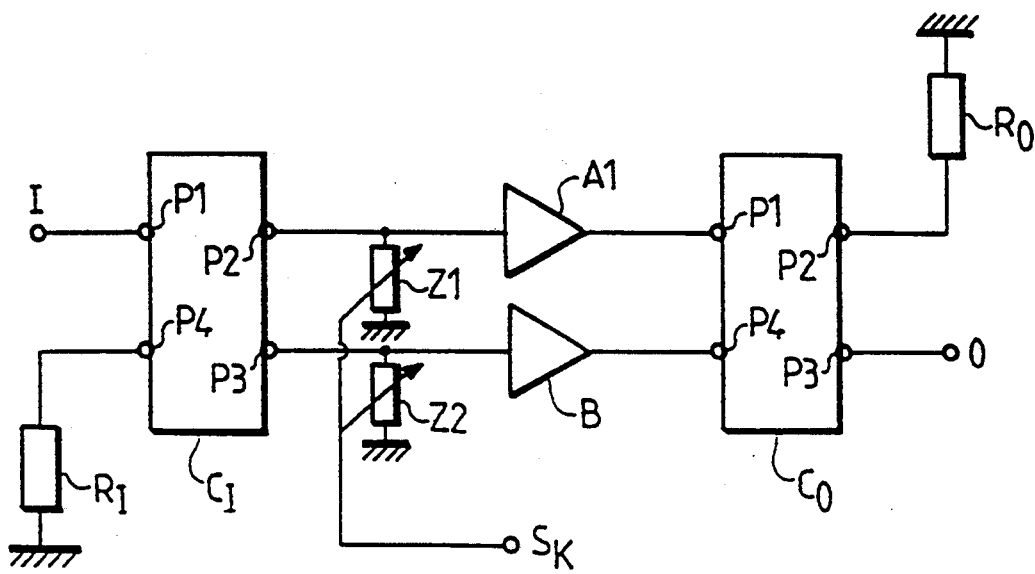

FIG. 2 shows another embodiment of an amplifier arrangement according to the invention. The references of the elements also used in FIG. 1 are not changed. This arrangement comprises an output coupler $C_O$ as described in said French Patent Specification, for example, and also comprises four connecting accesses numbered P1 to P4, and the two systems A1 and B are amplifier systems. Access P1 of the output coupler $C_O$ is connected to the output of the first amplifier system A1.

The output coupler access P2 is an isolating access connected to earth via a second resistor $R_0$. Output coupler access P3 forms the output 0 of the amplifier arrangement. Output coupler access P4 is connected to the output of the second amplifier system B.

If the two amplifier systems A1 and B are identical, the structure described above presents the advantage of attenuating the intermodulation owing to stray signals received by the output of the amplifier arrangement and coming from neighbouring arrangements. In effect, such stray signals will intermodulate the output stages of the two amplifier arrangements with a phase shift of 90°. The intermodulation products, which are shifted through 90° one channel relative to another, are phase shifted through 180° relative to the output of the arrangement, and so cancel each other out.

Figure 3:
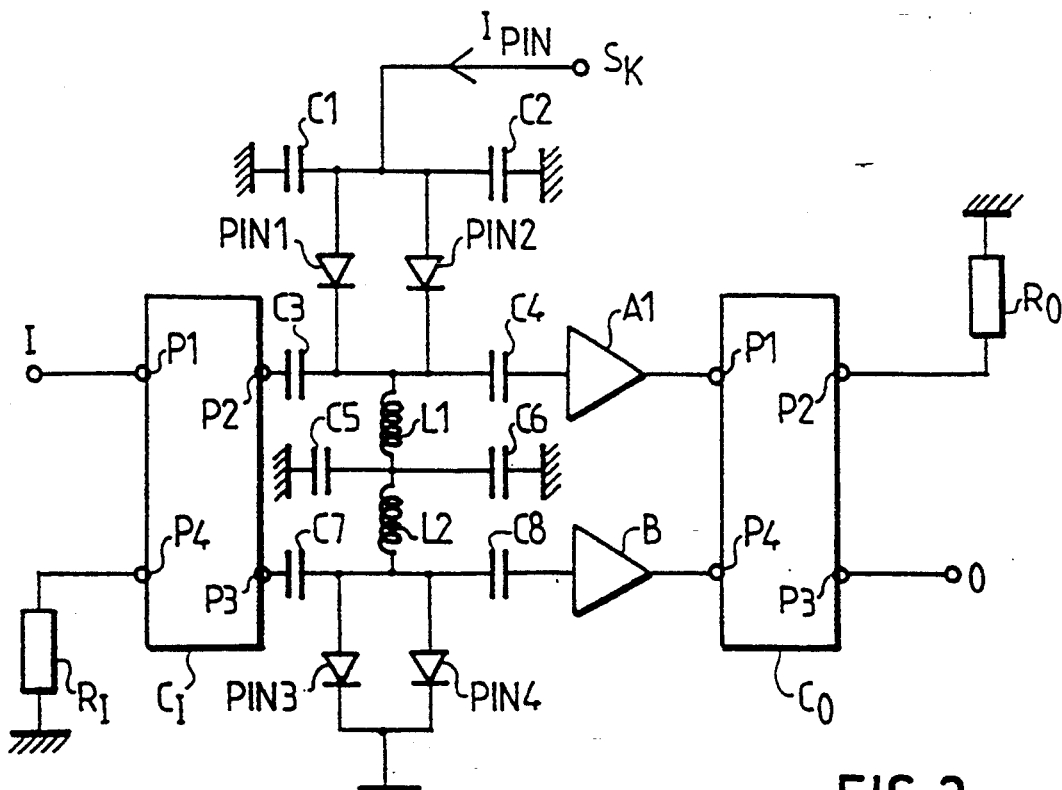
FIG. 3 is another embodiment of an arrangement according to the invention.

FIG. 3 describes in a more detailed manner the mismatch circuit. The references of the elements also used in FIG. 2 are not changed. The variable impedance circuit comprises four PIN-diodes PIN1, PIN2, PIN3 and PIN4, two coils L1 and L2 and eight capacitors numbered C1 to C8. The two first diodes PIN1 and PIN2 are arranged in parallel. Their anodes are connected, on the one hand, to the input for the control signal $S_K$ and, on the other hand, to earth via a parallel combination of the two capacitors C1 and C2. Their cathodes are connected to the input of the first amplifier system A1 via the capacitor C4 and to the access P2 of the input coupler $C_I$ via the capacitor C3. The diodes PIN3 and PIN4 are also arranged in parallel. Their cathodes are connected to earth. Their anodes are connected to the input of the second amplifier system B via the capacitor C8, and to the access P3 of the input coupler $C_I$ via the capacitor C7. The cathodes of the diodes PIN1 and PIN2 are connected to the anodes of the diodes PIN3 and PIN4 via a series combination of the two coils L1 and L2, their junction point being connected to earth via the parallel combination of two capacitors C5 and C6.

The capacitors C3, C4, C7 and C8 make it possible to isolate from the mismatch circuit, for DC current, the input coupler $C_I$ as well as the inputs of the two amplifier systems A1 and B. The capacitors C1, C2, C5 and C6 form connections to earth for high frequencies. Due to the coils L1 and L2, the two PIN-diode groups (PIN1, PIN2, and PIN3, PIN4) are passed through by the same DC control current, $I_{pin}$, which results in that they are given a practically identical dynamic impedance. By varying the control current $I_{pin}$ supplied at input $S_K$, the input impedances of the two amplifier systems A1 and B can be mismatched in identical manner. Their gain is thereby diminished and the output power can be reduced to the sought value.

The arrangement according to the invention makes it possible to obtain a particularly advantageous performance for an input power of the order of 1 W and a gain of approximately 20 dB.

Figure 4:
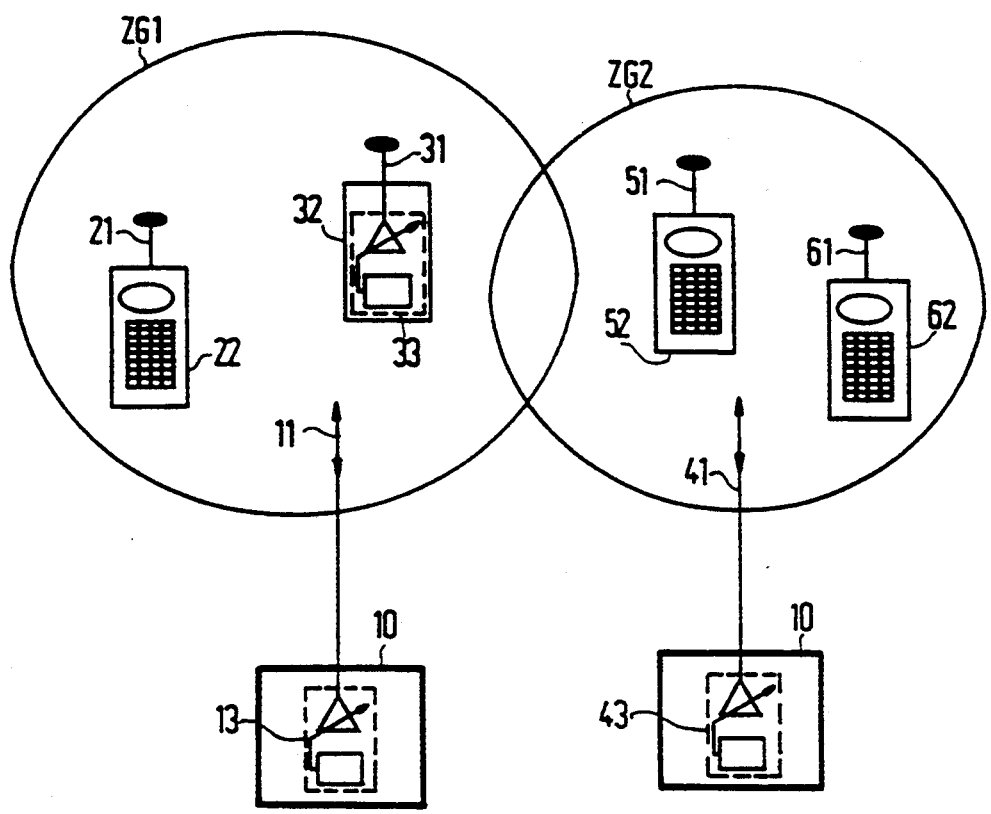
FIG. 4 shows a mobile radio system formed by a plurality of transceiver stations, which system comprises an amplifier arrangement according to the invention.

FIG. 4 represents a mobile radio system formed by:
a base transceiver station 10 comprising a transceiving antenna 11 for covering a geographical area ZG1 in which two mobiles move about which comprise a transceiving antenna 21 and 31 respectively, and a mobile transceiver station 22 and 32, and a base transceiver station 40 comprising a transceiving antenna 41 for covering a geographical area ZG2 in which two mobile transceiver stations 52 and 62 move about which comprise a transceiving aerial 51 and 61 respectively. The six transceiver stations, 10, 22 and 32 on the one hand and 40, 52 and 62, on the other hand, each comprise an amplifier arrangement according to the invention. Only the arrangements 13, 33 and 43 of the stations 10, 30 and 40 are shown in the drawing Figure.

When limiting thus the output power of these stations, it is possible to avoid interference between the geographical areas, covered by each of base transceiver stations 10 and 40 and between the various transceiver stations.

Needless to observe that modifications may be made in the embodiments which have just been described, more specifically, by substituting equivalent technical means without departing from the scope of the invention.

I claim:
1. A high frequency amplifying system comprising:
an input coupling circuit having an input terminal for receiving a high frequency signal to be amplified and a pair of output terminals, said input coupling circuit coupling the received signal from said input terminal to said output terminals and also producing phase shifts between said input and output terminals which attenuate reflection there-between of intermodulation products resulting from the presence of interfering signals at any of said terminals;
a pair of high frequency amplifiers each having an input impedance; and
an impedance mismatch circuit connecting an input of each of said pair of amplifiers to a respective one of the output terminals of said input coupling circuit, said impedance mismatch circuit being controllable by a control signal supplied thereto to produce a variable impedance mismatch between said input coupling circuit and the input impedances of said amplifiers, thereby providing adjustable gain control of said amplifying system;
the mismatched impedances of said amplifiers, as seen at the relevant output terminals of said input coupling circuit, being substantially the same.

2. An amplifying system as claimed in claim 1, further comprising an output coupling circuit having an output terminal and a pair of input terminals each coupled to an output of a respective one of said amplifiers, said output coupling circuit coupling signals at the outputs of said amplifiers to the output terminal of said output coupling circuit and also producing phase shifts between the input terminals and output terminal of said output coupling circuit which attenuate reflection therebetween of intermodulation products resulting from the presence of interfering signals at any of the said terminals.

3. An amplifying system as claimed in claim 2, wherein at least one of said input coupling circuit and output coupling circuit is a 90° hybrid coupler.

4. An amplifying system as claimed in claim 1, wherein said impedance mismatch circuit has an impedance which is variable in response to a control signal supplied to at least one PIN diode comprised therein.

5. An amplifying system as claimed in claim 1 comprised in a transceiver station of a mobile radio network.

* * * * *